United States Patent [19]
Gil Delicado

[11] Patent Number: 6,116,913
[45] Date of Patent: Sep. 12, 2000

[54] INTERCONNECTION UNIT

[75] Inventor: Emilio Gil Delicado, Madrid, Spain

[73] Assignee: Alcatel, Paris, France

[21] Appl. No.: 09/184,251

[22] Filed: Nov. 2, 1998

[30] Foreign Application Priority Data

Nov. 6, 1997 [ES] Spain ............................. 9702310

[51] Int. Cl.7 ................................................ H01R 9/09
[52] U.S. Cl. ..................................... 439/61; 439/49
[58] Field of Search ............................. 439/61, 62, 59, 439/43, 44, 49, 54

[56] References Cited

U.S. PATENT DOCUMENTS

| | | | |
|---|---|---|---|
| 5,037,310 | 8/1991 | Marinello | 439/61 |
| 5,040,992 | 8/1991 | Miyamoto et al. | 439/61 |
| 5,234,348 | 8/1993 | Konsevich et al. | 439/61 |
| 5,906,512 | 5/1999 | Reynolds | 439/61 |

FOREIGN PATENT DOCUMENTS

| | | |
|---|---|---|
| 0 188 965 A1 | 7/1986 | European Pat. Off. . |
| 41 30 615 A1 | 3/1993 | Germany . |
| 7-162171 | 6/1995 | Japan . |
| 7-221474 | 8/1995 | Japan . |

*Primary Examiner*—Khiem Nguyen
*Assistant Examiner*—Son V. Nguyen
*Attorney, Agent, or Firm*—Sughrue, Mion, Zinn, Macpeak & Seas, PLLC

[57] ABSTRACT

Interconnection unit (1) for transferring signals between board connectors P1, . . . , Pn for receiving printed circuit boards, situated on the front part of the interconnection unit, and cable connectors C1, . . . , Cm for receiving cables.

The cable connectors C1, . . . , Cm are located on the upper front part and on the lower front part of the interconnection unit (1), such that the board connector P1, . . . , Pn are located in the central part of the interconnection unit (1). Thus, the board connectors P1, . . . , Pn and the cable connectors C1, . . . , Cm are aligned in lines parallel to one side of the interconnection unit (1).

2 Claims, 3 Drawing Sheets

INTERCONNECTION UNIT

The present invention refers to an interconnection unit having various connectors for receiving printed circuit boards, including electronic components, and also for receiving cables. This interconnection unit facilitates the electrical connection among the different devices housed in the connectors.

BACKGROUND OF THE INVENTION

A rack for electronic equipment, for example belonging to telecommunications systems, contains printed circuit boards on which are mounted electronic components and cables that connect said printed circuit boards to others, which may be situated in the same rack or in another, for example. The connection is effected in an interconnection unit, a backpanel.

A rack has at least a subrack on which are mounted the printed circuit boards, parallel to each other and perpendicular to the backpanel, since the latter is normally fixed to the rear part of the subrack in a plane perpendicular to the circuit boards. In summary, if the rack is viewed from the front, a front view of the backpanel is seen, while the view obtained of the printed circuit boards is an elevation.

The physical design of the rack is such that it permits assembly and disassembly of the printed circuit boards through its front part, since the racks normally have their back against another surface, such as for example a wall or the rear part of another rack, which does not permit access to the rack from the rear. In the same way, the cables for connecting the printed circuit boards of one rack with another rack, are also handled from the front side of the rack. Consequently, both the external cables and the printed circuit boards are connected and disconnected from the front part.

The backpanel comprises connectors to receive both the printed circuit boards and the cables that communicate with the exterior of the rack or with another subrack in the same rack.

To effect the electrical connection between the contacts of the different connectors, the backpanel is normally made up of various layers of printed circuit, on which the conductive tracks that connect electrically the contacts each other are laid.

The number of layers is a function of the number of electrical connections that have to be made, that is of the number of conductive tracks. Thus, to facilitate the layout of the tracks the connectors for the printed circuit boards are positioned in parallel on one sector of the backpanel, for example in the upper part, while in the other sector, the lower part, the cable connectors are mounted.

In summary, the connectors for printed circuit boards and for cables are normally aligned along a vertical axis, in this way maintenance personnel can easily identify the correspondence between cable and printed circuit board.

Nowadays, printed circuit boards are presenting higher levels of integration density, implying that more and more electronic components can be mounted on them, whereby their connectors have more contacts in order to communicate with the exterior.

As a result, a backpanel with the same number of connectors for printed circuit boards has to incorporate more connectors for cables and, consequently, to increase the number of tracks for connecting the contacts of board connectors with the board connectors, thus making necessary to increase the number of printed circuit layers that constitute the backpanel.

However, the backpanel cannot increase the number of layers indefinitely, since it would become unmanageable from the maintenance point of view. Moreover, as the number of layers increases, the cost rises rapidly.

SUMMARY

Thus, an object of the present invention, is to provide an interconnection unit that connects electrically a number of connectors for printed circuit boards with cable connectors, such that said interconnection unit is easy to manage and house in a subrack of a rack, and additionally has a lower cost.

A further object of the present invention is to provide an interconnection unit that can effect a large number of electrical connections between the connectors for printed circuit boards and the cable connectors, in such a way that said interconnection unit includes a reduced number of printed circuit layers.

These and other objects are accomplished by the interconnection unit of the invention which transfers signals between board connectors for receiving a plurality of printed circuit boards, these connectors being located in the front part of the interconnection unit, and cable connectors for receiving a plurality of cables.

The cable connectors are located in the upper front part and in the lower front part of said interconnection unit, in such a way that the board connectors are located in the central part of said interconnection unit, that is, between the cable connectors located in the upper part and the cable connectors located in the lower part of said interconnection unit.

Thus, said board connectors and said cable connectors are aligned in rows parallel to one side of said interconnection unit.

In summary, a number of conductive tracks laid on printed circuit layers, that form said interconnection unit, electrically connect the contacts of the board connectors to the cable connectors, and they are distributed between the upper and the lower parts of said interconnection unit, in such a way that each printed circuit layer is more ideally employed by having conductive tracks running towards the upper and lower parts of the interconnection unit.

As a result, the interconnection unit is formed by less printed circuit layers, said unit being more manageable, simpler to manufacture and, therefore, of lower cost.

BRIEF DESCRIPTION OF THE DRAWINGS

A more detailed explanation of the invention is provided in the following description, based on the figures attached, in which.

DETAILED DESCRIPTION OF THE PREFERRED EMBODIMENT

Figure 1:
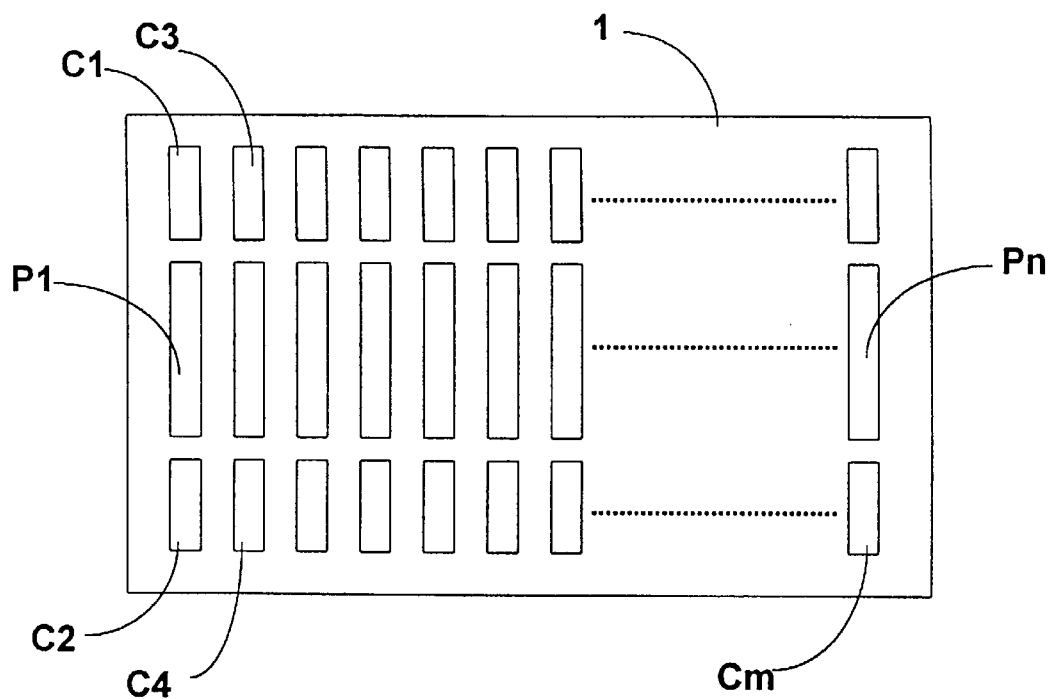
FIG. 1 shows a front view of an interconnection unit with the layout of a number of connectors, there being connectors for printed circuit boards and for cables, according to the invention.

FIG. 1 shows a front view of an interconnection unit 1, just as it would be seen from the front part of a rack for telecommunications equipment.

The interconnection unit 1 transfers signals between board connectors P1, ..., Pn, located on the front part of the interconnection unit 1, and cable connectors C1, ..., Cm located on the upper front part and lower front part of said interconnection unit 1.

As a result, the board connectors P1, ..., Pn are located in the central part of said interconnection unit 1, that is, between the cable connectors C1, ..., Cm located on the upper part and the cable connectors located on the lower part of said interconnection unit 1.

Thus, said board connectors P1, ..., Pn and said cable connectors C1, ..., Cm are aligned in lines parallel to one side of said interconnection unit 1.

Since the connectors of the interconnection unit 1 are located in the front part of the latter, the rack that holds it need not necessarily be accessible from the rear, thereby permitting it to be mounted with its back to a wall or against the back of another rack.

Also, connection and disconnection of boards and cables is done from the front of the rack, this being an agreeable operation for telecommunications equipment maintenance personnel.

Figure 2:
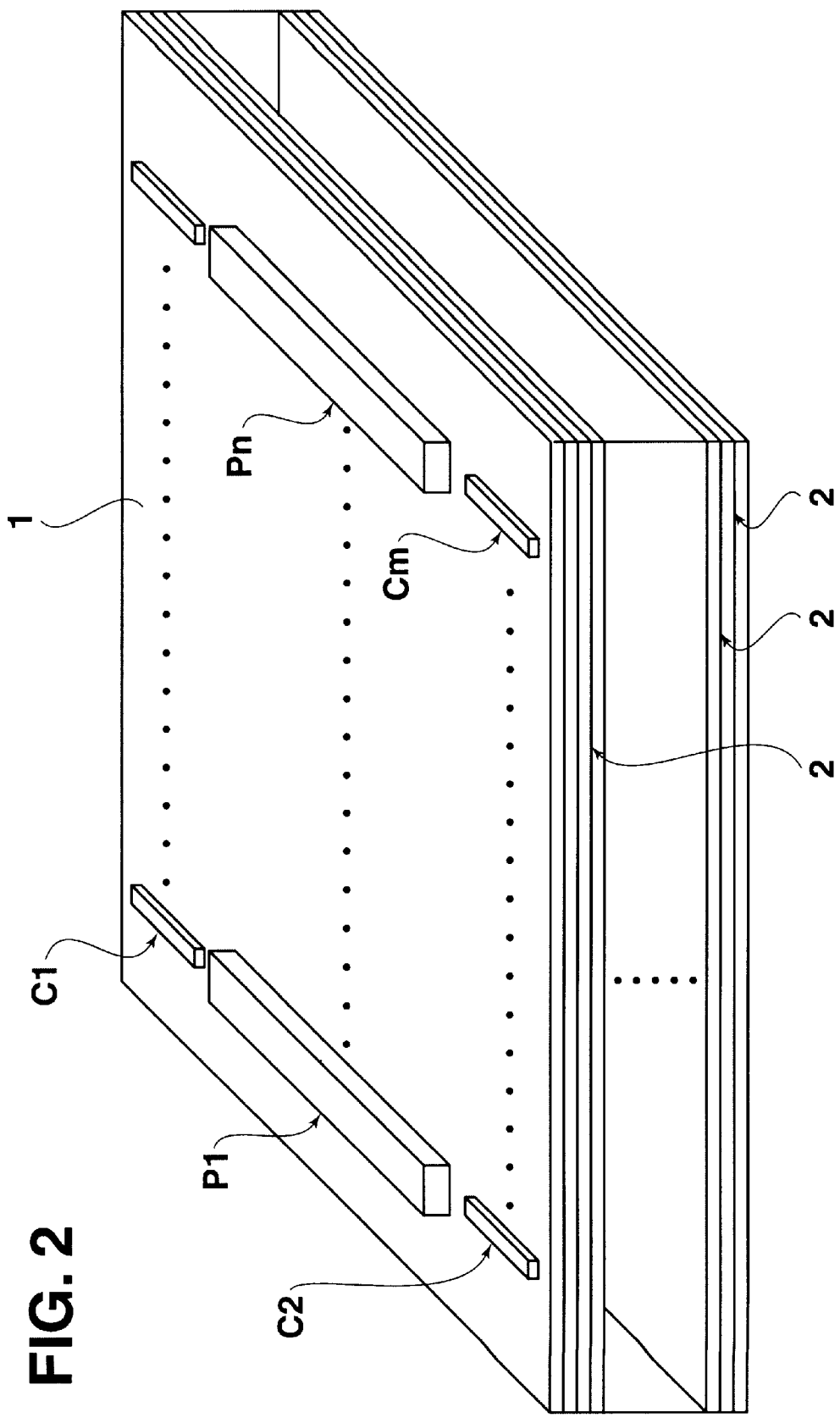
FIG. 2 shows a perspective view of an interconnection unit with the printed circuit board.
Figure 3:
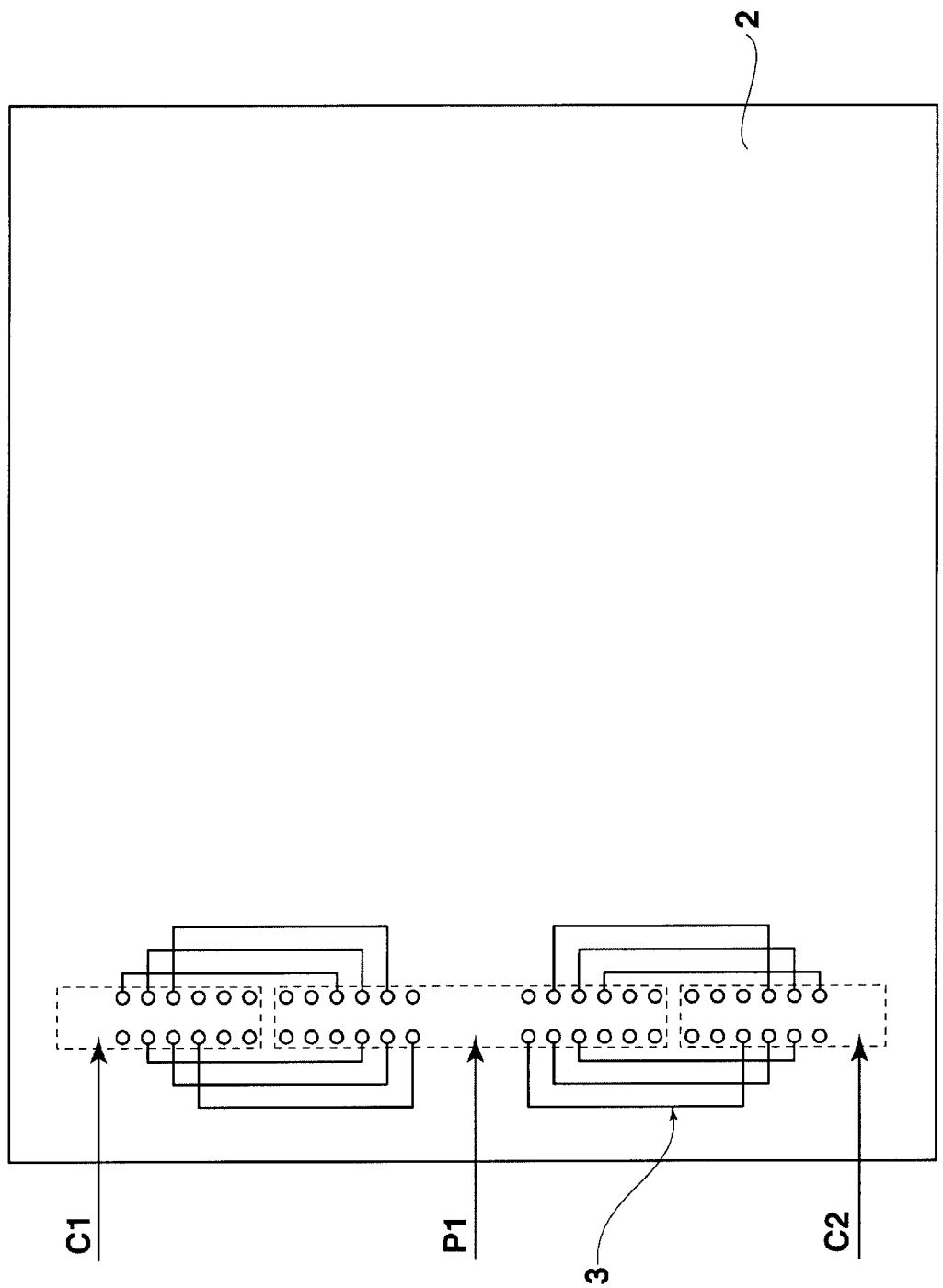
FIG. 3 shows a bottom view of an interconnection unit with conductive tracks.

The interconnection unit 1 is formed by a plurality of printed circuit layers, (see FIGS. 2 and 3) on which conductive tracks 3 for electrically connecting the contacts of board connectors P1, ..., Pn with cable connectors C1, ..., Cm are laid.

The conductive tracks are distributed between the upper part and the lower part of said interconnection unit 1, in such a way that each printed circuit layer is more ideally employed by having conductive tracks running towards the upper and lower parts of the interconnection unit 1.

As a result, the interconnection unit 1 is formed by less printed circuit layers, said unit being more manageable, simpler to manufacture and, consequently, of lower cost.

What is claimed is:

1. An interconnection unit for transferring signals between at least one board connector for receiving a printed circuit board and located on a front part of said interconnection unit, and a plurality of cable connectors for receiving cables, wherein said cable connectors are located in an upper front part and in a lower front part of said interconnection unit, such that said board connector is located between a first cable connector of said cable connectors located in the upper front part and a second cable connector of said cable connectors located in the lower front part, said board connector, the first cable connector and the second cable connector being aligned in a vertical line and parallel to one another at one side of said interconnection unit.

2. The interconnection unit according to claim 1, further comprising a plurality of printed circuit layers on which are laid a plurality of conductive tracks for connecting electrically the contacts of said cable connectors with the contacts of said board connector, such that said conductive tracks are shared between the upper front part and the lower front part of said interconnection unit.

* * * * *